(12) United States Patent
Usui

(10) Patent No.: US 11,557,112 B1
(45) Date of Patent: Jan. 17, 2023

(54) METHODS AND SYSTEMS FOR FEATURE RECOGNITION OF TWO-DIMENSIONAL PRINTS FOR MANUFACTURE

(71) Applicant: PROTOLABS, INC., Maple Plain, MN (US)

(72) Inventor: Shuji Usui, Minneapolis, MN (US)

(73) Assignee: PROTOLABS, INC., Maple Plain, MN (US)

( * ) Notice: Subject to any disclaimer, the term of this patent is extended or adjusted under 35 U.S.C. 154(b) by 0 days.

(21) Appl. No.: 17/689,452

(22) Filed: Mar. 8, 2022

(51) Int. Cl.
| | |
|---|---|
| G06T 7/00 | (2017.01) |
| G06V 10/84 | (2022.01) |
| G06T 7/136 | (2017.01) |
| G06T 7/33 | (2017.01) |
| G06F 30/10 | (2020.01) |

(52) U.S. Cl.
CPC ............. *G06V 10/84* (2022.01); *G06T 7/136* (2017.01); *G06T 7/344* (2017.01); *G06F 30/10* (2020.01); *G06T 2207/20081* (2013.01)

(58) Field of Classification Search
CPC ......... G06V 10/84; G06T 7/136; G06T 7/344; G06T 2207/20081; G06F 30/10
See application file for complete search history.

(56) References Cited

U.S. PATENT DOCUMENTS

| | | | | |
|---|---|---|---|---|
| 2004/0213447 A1* | 10/2004 | Roehrig | ................. | G16H 50/20 |
| | | | | 382/132 |
| 2009/0169113 A1* | 7/2009 | Geiger | ...................... | G06T 7/12 |
| | | | | 382/203 |
| 2020/0184133 A1* | 6/2020 | Machalica | .............. | G06F 30/27 |
| 2020/0349303 A1* | 11/2020 | Burton | .................... | G06F 30/17 |

FOREIGN PATENT DOCUMENTS

| | | |
|---|---|---|
| CN | 112418123 B | 8/2021 |
| DE | 19545754 A1 | 6/1997 |
| KR | 101355336 B1 | 1/2014 |

* cited by examiner

*Primary Examiner* — Ping Y Hsieh
(74) *Attorney, Agent, or Firm* — Caldwell Intellectual Property Law, LLC

(57) ABSTRACT

An apparatus for feature recognition of two-dimensional prints is illustrated. The apparatus comprise a processor and a memory communicatively connected to the processor. The memory contains instructions configuring the processor to receive a two-dimensional print of a part for manufacture, scale two-dimensional print so that the two-dimensional print is within a predetermined area, identify a curve feature of the two-dimensional print as a function of scaling of the two-dimensional print, wherein the curve feature comprises a plurality of line segments, and classify a line type of the curve feature using line observations as a function of the curve feature identification.

18 Claims, 8 Drawing Sheets

METHODS AND SYSTEMS FOR FEATURE RECOGNITION OF TWO-DIMENSIONAL PRINTS FOR MANUFACTURE

FIELD OF THE INVENTION

The present invention generally relates to the field of computer-aided design and structure fabrication. In particular, the present invention is directed to methods and systems for feature recognition of two-dimensional prints for manufacture.

BACKGROUND

Computer-aided drawings typically convey information about a to-be-fabricated structure, such as a part or an assembly of components of a part. However, information in computer-aided drawings sometimes cannot be extracted with available software.

SUMMARY OF THE DISCLOSURE

In an aspect, an apparatus for feature recognition of two-dimensional prints is illustrated. The apparatus comprise a processor and a memory communicatively connected to the processor. The memory contains instructions configuring the processor to receive a two-dimensional print of a part for manufacture, scale the two-dimensional print to fit a predetermined area, identify a curve feature of the two-dimensional print as a function of scaling the two-dimensional print, wherein the curve feature comprises a plurality of line segments, and classify the curve feature to a line type of as a function of the curve feature identification and at least a line observation.

In another aspect, a method for feature recognition of two-dimensional prints is described. The method is performed by a processor and comprises receiving a two-dimensional print of a part for manufacture, scaling the two-dimensional print to fit a predetermined area, identifying a curve feature of the two-dimensional print as a function of scaling the two-dimensional print, wherein the curve feature comprises a plurality of line segments, and classifying the curve feature to a line type of as a function of the curve feature identification and at least a line observation.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

Figure 1:
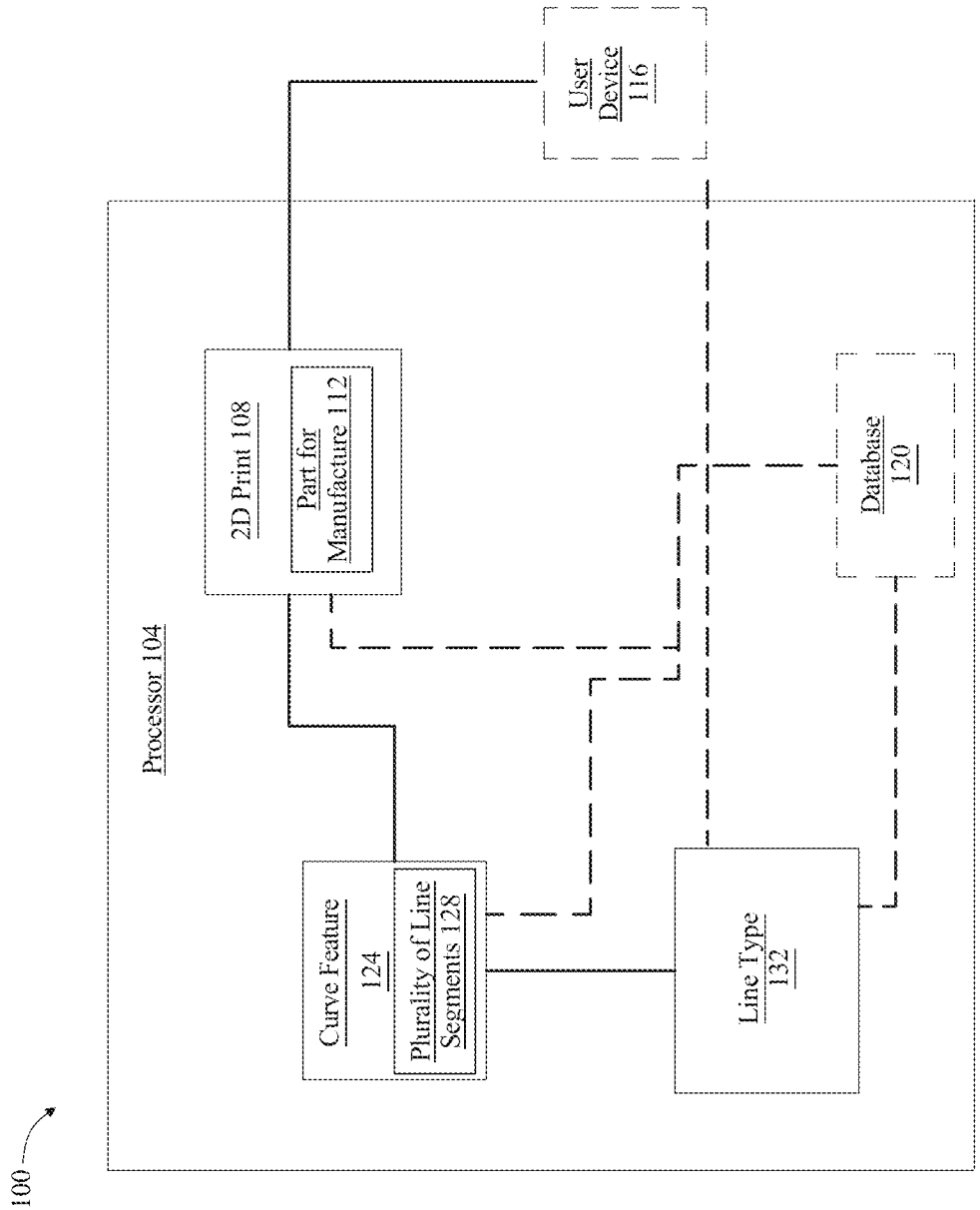
FIG. 1 is a high-level block diagram illustrating an embodiment of a system for feature recognition of two-dimensional prints for manufacture.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

At a high level, the present disclosure is directed to recognition of two-dimensional prints for manufacture. Aspects of the present disclosure may include a processor. Aspects of the present disclosure may also include a memory communicatively connected to the processor, wherein the memory contains instructions configuring the processor to perform a series of steps. Aspects of the present disclosure may include the processor receiving a two-dimensional print of a part for manufacture. Aspects of the present disclosure may include the processor scaling a drawing of the two-dimensional print so that the two-dimensional print is within a predetermined area. Aspects of the present disclosure may include the processor identifying a curve feature of the two-dimensional print as a function of scaling the drawing of the two-dimensional print. Aspects of the present disclosure may include the processor classifying a line type of the curve feature using line observations as a function of the curve feature identification Each manufacturing process used may be any suitable process, such as, subtractive manufacturing, additive manufacturing, and forming manufacturing. Examples of manufacturing processes that may be used include, but are not limited to, rotary-tool milling, drilling, turning, electronic discharge machining, ablation, etching, erosion, cutting, cleaving, 3D printing, injection molding, casting, stamping, forming, depositing, extruding, sintering, among others. Fundamentally, there is no limitation on the type of manufacturing process(es) used.

In some embodiments, the equipment used for manufacturing a part, such as adding, removing, and/or forming material may be of the computerized numerical control (CNC) type that is automated and operates by precisely programmed commands that control movement of one or more parts of the equipment to affect the material. CNC machines, their operation, programming, and relation to computer aided manufacturing (CAM) tools and computer aided design (CAD) tools are well known and need not be described in detail herein for those skilled in the art to understand the scope of the present invention and how to practice it in any of its widely varying forms.

Referring now to FIG. 1, a block diagram of system 100 for feature recognition of two-dimensional prints for manufacture is illustrated. In this disclosure, "feature recognition" refers ability to identify and define a region of a part with some interesting geometric or topological properties. In this embodiment, feature recognition is performed by a processor. System 100 comprises processor 104, two-dimensional print 108, part for manufacture 112, user device 116, database 120, curve feature 124, plurality of line segments 128, and line type 132.

Still referring to FIG. 1, system 100 includes a processor 104. Processor 104 may include any computing device as described in this disclosure, including without limitation, a microcontroller, and/or microprocessor as described in this disclosure. Processor 104 may include, be included in, and/or communicate with a mobile device such as a mobile telephone or smartphone. Processor 104 may include a single computing device operating independently, or may include two or more computing device operating in concert, in parallel, sequentially or the like; two or more computing devices may be included together in a single computing device or in two or more computing devices. Processor 104 may interface or communicate with one or more additional devices as described below in further detail via a network interface device. Network interface device may be utilized for connecting processor 104 to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. Processor 104 may include but is not limited to, for example, a computing device or cluster of processors and/or computing devices in a first location and a second computing device or cluster of computing devices in a second location. Processor 104 may include one or more processors dedicated to data storage, security, distribution of traffic for load balancing, and the like. Processor 104 may distribute one or more computing tasks as described below across a plurality of computing devices of computing device, which may operate in parallel, in series, redundantly, or in any other manner used for distribution of tasks or memory between computing devices. Processor 104 may be implemented using a "shared nothing" architecture in which data is cached at the worker, in an embodiment, this may enable scalability of system 100 and/or computing device.

Processor 104 may be designed and/or configured to perform any method, method step, or sequence of method steps in any embodiment described in this disclosure, in any order and with any degree of repetition. For instance, processor 104 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Processor 104 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Continuing to refer to FIG. 1, processor 104 is configured to receive a two-dimensional print 108 of a part for manufacture 112. A "part for manufacture," as used in this disclosure, is a part to be manufactured, wherein manufacturing may include any manufacturing process as described in the entirety of this disclosure. The part may include any item made of materials such as metals including, for example, aluminum and steel alloys, brass, and the like, plastics, such as nylon, acrylic, ABS, Delrin, polycarbonate, and the like, foam, composites, wood, etc. two-dimensional print 108 may be any two-dimensional print 108 of part for manufacture 112, such that the two-dimensional print 108 may include any data describing the part for manufacture 112. As used in this disclosure, "two-dimensional" means having, appearing to have, or displaying two out of the three dimensions length, width, and height. two-dimensional print 108 may include semantic information of part for manufacture 112. "Semantic information", as described in this disclosure, is data concerning and/or describing product and manufacturing information (PMI) and/or product life cycle management (PLM). PMI, as used in this disclosure, is data describing non-geometric attributes of a model of a part for manufacture, such as two-dimensional print 108, necessary for manufacturing the part, components of the part, and associated assemblies. For example and without limitation, PMI may include geometric dimensions and tolerances, annotation and dimensions, surface finish, material specifications, and the like. PMI may include textual data, such as alphanumeric, punctuation, typographical symbols, character, string data, and/or any textual data as described in the entirety of this disclosure. PLM, as used in this disclosure, is any data concerning and/or describing management of the lifecycle of the part from inception, through engineering design and manufacture, to service and disposal of the manufactured part. PLM may include textual data, such as alphanumeric, punctuation, typographical symbols, character, string data, and/or any textual data as described in the entirety of this disclosure. In an embodiment, semantic information included in two-dimensional print 108 may be used in processes for pricing a part to be manufactured. Additionally, two-dimensional print 108 may include geometric dimensioning and tolerancing (GD&T) information, which may be provided in one or more software files such as DXF files, DWG files, PDF files, and/or the like. two-dimensional print 108 may be received with a computer model of part for manufacture 112 or received in a separate transmission and/or from another source. A "computer model", as described herein, is a digital model of a physical structure as created using computer-aided design (CAD) modeling software. Processor 104 may receive two-dimensional print 108 from a user device 116. User device 116 may include, without limitation, a transmission of communication with at least a server; transmission may include any transmission as described herein. A user device 116 may include an additional computing device, such as a mobile device, laptop, desktop computer, or the like; as a non-limiting example, the user device 116 may be a computer and/or workstation operated by an engineering professional. Persons skilled in the art, upon reviewing the entirety of this disclosure, will be aware of various devices which may be suitable for use as user device 116 consistently with this disclosure. two-dimensional print 108 may be stored in a database 120, which may be in system 100 or remote. Database 120 may store information pertaining to, for example, a request for a part to be manufactured, various machines used in manufacturing, materials used to manufacture the part, and the like. Database 120 is described in more detail below in reference to FIG. 3. two-dimensional print 108 may be retrieved from memory and/or database 120.

Continuing to refer to FIG. 1, database 120 may be implemented, without limitation, as a relational database, a key-value retrieval datastore such as a NOSQL database, or any other format or structure for use as a datastore that a person skilled in the art would recognize as suitable upon review of the entirety of this disclosure. Dataset may be stored in any suitable data and/or data type. For instance and without limitation, dataset may include textual data, such as numerical, character, and/or string data. Textual data may include a standardized name and/or code for in-process and/or post-processing manufacturing, or the like; codes may include raw material codes, dimensional codes, calibration codes, mechanical and/or thermal testing codes, safety codes, and/or data formatting codes, which may include without limitation codes used in CAD 3D geometry, assembly and PMI standards such as STEP AP242, ASME Y14.5 geometric dimensioning and tolerancing (GD&T) symbols, ASME Y14.41 digital product definition data practices, ASME Y14.100 Engineering Drawing Practices, ASME Y14.36 Surface Texture Symbols and ASME B46-I surface texture. In general, there is no limitation on forms textual data or non-textual data used as dataset may take; persons skilled in the art, upon reviewing the entirety of this disclosure, will be aware of various forms which may be suitable for use as dataset consistently with this disclosure.

Still referring to FIG. 1, processor 104 may be configured to extract a semantic datum from two-dimensional print 108 of part for manufacture 112. As used in this disclosure, a "semantic datum" is an element of data describing and/or identifying semantic information in and/or from a print of a part for manufacture. Semantic datum may include geometric dimensions and tolerances such as geometric tolerance, annotation and dimensions, surface roughness, surface finish, material specifications, PMI, PLM, and the like. As used in this disclosure, a "geometric tolerance" is a quantified limit of allowable error of one or more physical attributes of a part for manufacture. Semantic datum may include a form tolerance such as straightness, flatness, circularity, and/or cylindricity; a profile tolerance such as profile of a line and/or profile of a surface; an orientation tolerance such as angularity, perpendicularity, and/or parallelism; location tolerance such as position, concentricity and/or symmetry; a runout tolerance such as circular runout and/or total runout; and the like. Semantic datum may be included in two-dimensional print 108 of part for manufacture 112 as symbols, annotations, numerical values, text, embedded information, and/or the like. As used in this disclosure, "text" includes letters, numbers, and/or symbols. two-dimensional print 108 may include an image representing part for manufacture 112 or a component of the part for manufacture 112, a number representing a numerical tolerance of the component, and/or an indicator that identifies the numerical tolerance is associated with the component. two-dimensional print 108 may also indicate a unit of measurement and/or a scale, which may be included in semantic datum or on which semantic datum may be based. For example, two-dimensional print 108 may state that the dimensions are in inches, list the scale as "2:1", include a circle representing an exterior cylindrical surface of part for manufacture 112, and have an arrow pointing from "R0.5000+/−0.0003" to the circle. Processor 104 may be configured to recognize "+/−" as a symbol representing a tolerance for the preceding number in the amount of the succeeding number. Processor 104 may also be configured to identify the arrow and that it is point from the numbers to the circle and determined that the tolerance is for the circle, specifically the radius of the circle. Processor 104 may be configured to identify the unit of measurement stated in two-dimensional print 108 and determine that the radius tolerance for the circle is +/−0.0003 inches. Processor 104 may also be configured to identify measurement scale and adjust numbers, including semantic datum, accordingly. Processor 104 may be configured to determine scale by comparing an annotation of measurement to an actual length in two-dimensional print 108. In some embodiments, processor 104 may recognize encoding in a file of two-dimensional print 108 as representing semantic datum and may extract semantic datum from the file. Semantic datum is described further herein with reference to FIG. 5.

Still referring to FIG. 1, system 100, such as processor 104 and/or a computing device communicatively connected to the processor 104, may be configured to identify an image in two-dimensional print 108 as representing part for manufacture 112. As used herein, "communicatively connected" is a process whereby one device, component, or circuit is able to receive data from and/or transmit data to another device, component, or circuit. Processor 104 may be configured to extract geometric dimensions of part for manufacture 112 including height, length, width, radius, depth, and/or the like and may be configured to extract their corresponding location, such as their coordinates. Processor 104 may also be configured to recognize lines including line segments and planes; shapes such as circles, arcs, ovals, ellipsis, polygons, irregular shapes, cylinders, segments of shapes, and the like; and/or markings; determine whether they are included in part for manufacture 112; extract their coordinates and measurements relative to a coordinate system in two-dimensional print 108 and associate the coordinates and measurements with their corresponding component of part for manufacture 112. For example, processor 104 may be configured to recognize that an image in two-dimensional print 108 is a circle; determine that it is an image representing part for manufacture 112; extract a center position, such as in x,y,z coordinates, and radius of the circle; and associate the center position and radius with the circle. Processor 104 may also be configured to recognize images in two-dimensional print 108 and/or two-dimensional print 108 as not representing part for manufacture 112 and excluding them such as, for example, lines identifying a coordinate system, annotation lines, centering marks, true position symbols, center lines, and the like. two-dimensional print 108 may include information identifying coordinates of the image. two-dimensional print 108 may identify that a center mark is not included with the image, which processor 104 may recognize and exclude the center mark from image representing part for manufacture 112. As another example, processor 104 may be configured to recognize an arc in two-dimensional print 108 is an arc, determine that the arc is a component of image representing part for manufacture 112 and should be included in the part for manufacture 112; extract the arc center, x,y,z coordinates, radius and angle; and associate the arc center, x,y,z coordinates, radius and angle with the arc. Coordinates and/or measurements of a component of part for manufacture 112 may be calculated based on information in two-dimensional print 108.

Still referring to FIG. 1, two-dimensional print 108 may also be received by processor 104 through a web application. In this disclosure, a "web application" application software that runs on a web server, unlike computer-based software programs that are run locally on the operating system, such as a processor. Web application may include, without limitation, a web user interface, an online submission request, a file from a website, or the like.

Still referring to FIG. 1, processor 104 is configured to scale two-dimensional print 108 so that two-dimensional print 108 is within a predetermined area. In this disclosure, "scaling" a drawing means adjusting the drawing in a way that shows a real object with accurate sizes reduced or enlarged by a certain amount. Scaling may include resizing the drawing to an original size of part of manufacture 112 to establish a correspondence to the scale of a 3D model of two-dimensional print 108; dimensions and scale of the drawing may be indicated in texts received by processor 104 with two-dimensional print 108. Resizing may include representing a part to scale, and/or at a 1:1 scale. Scaling two-dimensional print 108 may include the use of a semantic datum. Scaling may also include verifying the scale and dimensions of the drawing. This may be performed by comparing a length of an object line to a length stated in an annotation of the two-dimensional print. An "object line" in this disclosure is line or feature from a 3D object whose length may be compared to a length from two-dimensional print 108 to verify its scale. A verifying machine-learning module may be used to verify the scale and dimensions of a drawing of a two-dimensional print, wherein a machine-learning module is further described herein with reference to FIG. 2. An "annotation" of two-dimensional print 108 is an element of textual information that may be received from two-dimensional print 108, such as a semantic datum as described above. Moreover, two-dimensional print 108 may be called to fit a predetermined area, wherein a "predetermined area" is an area defined by a plurality of pre-set boundaries in which the scale of two-dimensional print 108 may not exceed these boundaries. Predetermined area may be, without limitation, the bounds of printed paper, the actual dimensions of the 3D part, or any other options that may limit the size of the drawing of two-dimensional print 108. This area may be preselected as a function of the original scale of the part, which may be indicated inside the predetermined area by a sort of line, shading, shape, or anything to mark the original size of part for manufacture. Scaling may include scaling down or scaling to a maximum size in which the part depiction fits within the predetermined area.

Referring still FIG. 1, processor 104 is further configured to identify a curve feature 124 of the two-dimensional print as a function of the scale of two-dimensional print 108. In this disclosure, a "curve feature" is a physical feature of two-dimensional print 108 of part of manufacture 112 that has a rounded shape. Curve feature may be, without limitation, a circle, arc, elliptical and/or ellipsoid shape, parabolic and/or paraboloid shape, trochoid, involute, spiral, any shape defined by a conic section and/or rotational volume thereof, spherical shape, any other rounded shape, mathematical curve representations and even linear or planar features. Curve feature 124 may comprise a plurality of line segments 128. Circles and arcs can be identified from these plurality of line segments 128. A "line segment" is defined by two endpoints and a straight line connecting them. A curvature of the circle or arc, and a transition of curvature along trochoid, involute and spiral can be computed over splines and line segments. Additionally, if needed, a circle or arc fitting may be used to identify curve feature 124. Curve feature 124 may be considered either a circle or an arc if a deviation from a perfectly circular circle or arc may be below a certain threshold. Additionally, a trochoid, involute and spiral fitting may be used to identify curve feature 124. Curve feature 124 may be considered either trochoid, involute and spiral if a deviation from a perfect trochoid, involute and spiral may be below a certain threshold. Threshold may be any deviation percent, such as 5%, 15%, or even 50%, which processor 104 may compute. In this disclosure, something is "perfectly circular" when every point on a circle or arc has the same diameter, thus a perfectly circular arc, if extended, would create a perfectly circular circle with the same diameter at every point on the circumference. Curve feature 124 may be classified as a circle or arc and a center and/or a radius may be calculated thereafter. Identifying the curve feature may include determining that the curve feature strays from a perfectly circular arc by less than a preconfigured threshold, as explained above, and then identifying the curve as an arc as a function of the determination. In the drawing, the center of the circle may be specified by center lines. "Center lines" are real or imaginary lines that run through a central axis of an object. In this disclosure, a "central axis" of an object is a line that passes through a centroid of the object. Center lines allow for verification of the correctness of the center as a function of confidence levels and thus classification of the center lines from the circle and arc object. A "confidence level" is the probability that the value of a parameter falls within a specified range of values. For example, when a computed center of a circle agrees with a center position indicated by center lines, a confidence level of a semantic PMI increases. If a computed center of a circle is not similar to a center position indicated by center lines, a confidence level of the semantic PMI decreases. Curve feature 124 may also not even be curved at all, but processor 104 can still identify it and classify its line type 132 using the plurality of line segments 128. Referring still FIG. 1, processor 104 is further configured to classify curve feature 124 to a line type 132 of as a function of the curve feature identification and at least a line observation. In this disclosure, a "line type" is a visual property assigned to a line that groups it with other lines based on their shared characteristics. In this disclosure, a "shared characteristic" is a characteristic that is shared between a group in the plurality of line segments, such as length, shape, etc. For example, but without limitation, line type 132 may include object lines, hidden lines, centerlines, extension lines, dimension lines, leader lines, cutting-plane lines, viewing-plane lines, etc. Observations of a line, or line observations, may be used to classify the line type 132 of a line. In this disclosure, a "line observation" is a characteristic of a line segment in two-dimensional print 108 that may be used to classify a line type of the line segment. These observations are used to help processor 104 classify line type 132. Line observations may include the superimposition of object lines on hidden lines, wherein "hidden lines" represent the edges where surfaces meet but are not directly visible and "object lines" are thick, continuous lines used to outline visible edges of an object. For example, a weight of object lines and hidden lines may be varied to distinguish superimposed lines. Line observations may also include the extension and dimension lines representing the limits of dimensions of the drawing's dimensions. A "dimension line" is a line that indicates direction and extent of a dimension while an "extension line" is a line that continues or extends from a surface of an object and establishes the size of the dimension. For example, an arrowhead of a dimension line touches an extension line. Both dimension lines and extension lines are thin (e.g., lower line weight) relative to other lines in the drawing of two-dimensional print 108. Line observations may include the positioning of center lines and verifying that they are in the correct location; for example, the correct position and location of center lines may include the center lines crossing orthogonally and ending outside of the object. Line observations may also include diameter annotations and radius annotations. For example, a diameter sign "0" may be placed in front of a diameter annotation of a drawing and an "R" may be placed in front of a radius annotation. An arrowhead of the diameter annotation may point to the circle object, while the radius annotation may be perpendicular to an arc of the circle object. Using these line observations, a probabilistic machine-learning module may be constructed, which may generate a classification for lines used in the drawings of the two-dimensional print 108. As a non-limiting example, a line observation of a specific line segment may be that it is passing through the center of the object, this this line segment may be categorized as a center line. As another non-limiting example, a line observation of a line segment may be that its line weight is very low compared to other lines which may categorize it as a dimension or extension line. Once line type 132 of curve feature 124 is classified, it may be considered a semantic datum of two-dimensional print 108. Additionally, the classification of line type 132 may also infer the product manufacturing information (PMI) semantics.

Still referring to FIG. 1, a probabilistic machine-learning model may be used to classify plurality of line segments 128 into line types 132. In some embodiments, probabilistic machine learning model may be accessed, for example from any of a storage component, a database, or another computing device. In some cases, probabilistic machine learning model may be accessed from another computing device by way of one or more networks, such as without limitation the Internet. In some embodiments, computing device may be additionally configured to train a probabilistic machine learning model. Probabilistic machine-learning model may include any machine-learning model as described in this disclosure. Processor may train probabilistic machine learning model using training data. Training data may include a plurality of training examples. Each training example of plurality of training examples may correlate one or more features to or with one or more probabilistic outcomes and/or other elements of data usable for computation of probabilistic outcomes. Processor may train probabilistic machine learning model as a function of and/or using any machine learning algorithm as described in this disclosure. In some cases, and as a non-limiting example, probabilistic machine learning algorithm may include one or more of a supervised machine learning algorithm and an unsupervised machine learning algorithm. Training data may include any training data described in this disclosure. Probabilistic machine-learning model may be trained using a Drawing Exchange Format (DXF)/DWG training data set model. DWG, short for drawing, refers to a binary file format used for containing 2D and 3D design data. DXF/DWG training data set model may use data software, such as AutoCAD, SolidWorks, or the like, to classify lines into line types 132. DXF/DWG training data set model may also collect data to be used as training data for the probabilistic machine-learning model. Other examples of training data may include line observations, curve features, or any information that may be used to help determine a line type 132. For example, an input of probabilistic machine-learning model may be a line observation, such as that a line has a lighter line weight than the other lines, and an output of the probabilistic machine-learning model may be a line type 132, such as that the line may be a dimension or extension line. Another example, identification of curve feature 124 may be used as an input and then output may be line type 132. Not only can data be taken from data software or databases, but it may also be entered through a user interface device, wherein a user can input manual data. Training data may be obtained from expert input or validated journal articles concerned about relevant information to the inputs and outputs of the probabilistic machine-learning model. In some embodiments, probabilistic machine learning model may be trained using an unsupervised machine learning algorithm and training data. "Training data," as used herein in this disclosure, is data containing correlations that a machine-learning process may use to model relationships between two or more categories of data elements. Multiple data entries in training data may evidence one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data according to various correlations; correlations may indicate causative and/or predictive links between categories of data elements, which may be modeled as relationships such as mathematical relationships by machine-learning processes as described in further detail below. Training data may be formatted and/or organized by categories of data elements, for instance by associating data elements with one or more descriptors corresponding to categories of data elements. Elements in training data may be linked to descriptors of categories by tags, tokens, or other data elements; for instance, and without limitation, training data may be provided in fixed-length formats, formats linking positions of data to categories such as comma-separated value (CSV) formats and/or self-describing formats such as extensible markup language (XML), JavaScript Object Notation (JSON), or the like, enabling processes or devices to detect categories of data.

Alternatively or additionally, training data may include one or more elements that are not categorized; that is, training data may not be formatted or contain descriptors for some elements of data. Machine-learning algorithms and/or other processes may sort training data according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, symbols may be identified by reference to lists in ASME Y14.5 geometric dimensioning and tolerancing (GD&T) symbols, ASME Y14.41 digitial product definition data practices, ASME Y14.100 Engineering Drawing Practices, ASME Y14.36 Surface Texture Symbols and ASME B46-I surface texture, or other compendium of terms, permitting ad-hoc categorization by machine-learning algorithms, and/or automated association of data in the data entry with descriptors or into a given format. The ability to categorize data entries automatedly may enable the same training data to be made applicable for two or more distinct machine-learning algorithms as described in further detail below. Training data used by the processor may correlate any input data as described in this disclosure to any output data as described in this disclosure. Machine-learning models are further described below.

Still referring to FIG. 1, probabilistic machine-learning model may include the use of a classifier. A "classifier," as used in this disclosure is a machine-learning model, such as a mathematical model, neural net, or program generated by a machine learning algorithm known as a "classification algorithm," as described in further detail below, that sorts inputs into categories or bins of data, outputting the categories or bins of data and/or labels associated therewith. A classifier may be configured to output at least a datum that labels or otherwise identifies a set of data that are clustered together, found to be close under a distance metric as described below, or the like. Computing device 104 and/or another device may generate a classifier using a classification algorithm, defined as a processes whereby a computing device 104 derives a classifier from training data. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers.

Still referring to FIG. 1, computing device 104 may be configured to generate a classifier using a Naïve Bayes classification algorithm. Naïve Bayes classification algorithm generates classifiers by assigning class labels to problem instances, represented as vectors of element values. Class labels are drawn from a finite set. Naïve Bayes classification algorithm may include generating a family of algorithms that assume that the value of a particular element is independent of the value of any other element, given a class variable. Naïve Bayes classification algorithm may be based on Bayes Theorem expressed as $P(A/B)=P(B/A) P(A) \div P(B)$, where $P(A/B)$ is the probability of hypothesis A given data B also known as posterior probability; $P(B/A)$ is the probability of data B given that the hypothesis A was true; $P(A)$ is the probability of hypothesis A being true regardless of data also known as prior probability of A; and $P(B)$ is the probability of the data regardless of the hypothesis. A naïve Bayes algorithm may be generated by first transforming training data into a frequency table. Computing device 104 may then calculate a likelihood table by calculating probabilities of different data entries and classification labels. Computing device 104 may utilize a naïve Bayes equation to calculate a posterior probability for each class. A class containing the highest posterior probability is the outcome of prediction. Naïve Bayes classification algorithm may include a gaussian model that follows a normal distribution. Naïve Bayes classification algorithm may include a multinomial model that is used for discrete counts. Naïve Bayes classification algorithm may include a Bernoulli model that may be utilized when vectors are binary.

With continued reference to FIG. 1, computing device 104 may be configured to generate a classifier using a K-nearest neighbors (KNN) algorithm. A "K-nearest neighbors algorithm" as used in this disclosure, includes a classification method that utilizes feature similarity to analyze how closely out-of-sample-features resemble training data to classify input data to one or more clusters and/or categories of features as represented in training data; this may be performed by representing both training data and input data in vector forms, and using one or more measures of vector similarity to identify classifications within training data, and to determine a classification of input data. K-nearest neighbors algorithm may include specifying a K-value, or a number directing the classifier to select the k most similar entries training data to a given sample, determining the most common classifier of the entries in the database, and classifying the known sample; this may be performed recursively and/or iteratively to generate a classifier that may be used to classify input data as further samples. For instance, an initial set of samples may be performed to cover an initial heuristic and/or "first guess" at an output and/or relationship, which may be seeded, without limitation, using expert input received according to any process as described herein. As a non-limiting example, an initial heuristic may include a ranking of associations between inputs and elements of training data. Heuristic may include selecting some number of highest-ranking associations and/or training data elements.

With continued reference to FIG. 1, generating k-nearest neighbors algorithm may generate a first vector output containing a data entry cluster, generating a second vector output containing an input data, and calculate the distance between the first vector output and the second vector output using any suitable norm such as cosine similarity, Euclidean distance measurement, or the like. Each vector output may be represented, without limitation, as an n-tuple of values, where n is at least two values. Each value of n-tuple of values may represent a measurement or other quantitative value associated with a given category of data, or attribute, examples of which are provided in further detail below; a vector may be represented, without limitation, in n-dimensional space using an axis per category of value represented in n-tuple of values, such that a vector has a geometric direction characterizing the relative quantities of attributes in the n-tuple as compared to each other. Two vectors may be considered equivalent where their directions, and/or the relative quantities of values within each vector as compared to each other, are the same; thus, as a non-limiting example, a vector represented as [5, 10, 15] may be treated as equivalent, for purposes of this disclosure, as a vector represented as [1, 2, 3]. Vectors may be more similar where their directions are more similar, and more different where their directions are more divergent; however, vector similarity may alternatively or additionally be determined using averages of similarities between like attributes, or any other measure of similarity suitable for any n-tuple of values, or aggregation of numerical similarity measures for the purposes of loss functions as described in further detail below. Any vectors as described herein may be scaled, such that each vector represents each attribute along an equivalent scale of values. Each vector may be "normalized," or divided by a "length" attribute, such as a length attribute l as derived using a Pythagorean norm:

$$l = \sqrt{\sum_{i=0}^{n} a_i^2},$$

where $a_i$ is attribute number i of the vector. Scaling and/or normalization may function to make vector comparison independent of absolute quantities of attributes, while preserving any dependency on similarity of attributes; this may, for instance, be advantageous where cases represented in training data are represented by different quantities of samples, which may result in proportionally equivalent vectors with divergent values.

Still referring to FIG. 1, system 100 may include graphics processing unit (GPU) operating on processor 104. A "GPU", as used in this disclosure, is a device with a set of specific hardware capabilities that are intended to map well to the way that various 3D engines execute their code, including geometry setup and execution, texture mapping, memory access, and/or shaders. GPU may be a processor, wherein a processor may include any processor as described in the entirety of this disclosure. GPU may include, without limitation, a specialized electronic circuit designed to rapidly manipulate and alter memory to accelerate the creation of images in a frame buffer. For instance, and without limitation, GPU may include a computer chip that performs rapid mathematical calculations, primarily for the purpose of rendering images. GPU may further include, without limitation, full scene anti-aliasing (FSAA) to smooth the edges of 3-D objects and anisotropic filtering (AF) to make images look crisper. GPU may include, without limitation, dedicated graphics cards, integrated graphics cards, hybrid graphics cards, and/or any combination thereof. GPU may be configured to identify curve feature 124 and classify its line type 132.

Still referring to FIG. 1, processor 104 may be configured to generate a manufacturing instruction based on classification of line type 132 of part for manufacture 112. As used in this disclosure, "manufacturing instructions" are instructions to manufacture a part for manufacture. Manufacturing instruction may include any data describing and/or identifying instructions to manufacture part for manufacture 112, such that manufacturing the part will produce a completed manufactured part. Manufacturing instruction may include all necessary instructions to manufacture part for manufacture 112. The part may be manufactured utilizing any suitable manufacturing process, such as subtractive manufacturing, additive manufacturing, injection molding, 3D printing, and the like. Manufacturing instruction may include text based on semantic datum and symbols in ASTM standards such as instructions for a user that are easier to read than semantic datum. Manufacturing instruction may include instructions not detailed in semantic datum that achieve manufacturing part for manufacture 112 within tolerance limits in semantic datum. Manufacturing instruction may include machine instructions based on semantic datum for one or more machines to execute to manufacture part for manufacture 112. Processor 104 may be configured to generate manufacturing instruction utilizing a machine-learning process. Processor 104 may be configured to use a machine-learning model, which may be trained on the processor 104 or another device. Instruction training data may correlate inputs and outputs. Instruction training data may be a plurality of data entries containing a plurality of inputs that are correlated to a plurality of outputs for training a processor by a machine-learning process to generate a manufacturing instruction. Instruction training data may include inputs, which may include semantic datum mapped on computer model. Instruction training data may include outputs, which may include the corresponding manufacturing instructions. Instruction training data may contain a plurality of data entries containing a plurality of inputs correlated to a plurality of outputs. Instruction training data may be collected by recording semantic data mapped on computer models 108 and their corresponding manufacturing instructions. Instruction training data may be collected from journal articles, publicly available information, manual generation of manufacturing instructions based on semantic datum on computer models, iterations of a machine-learning process, self-learning, and the like. Instruction training data may be stored in database 120. Processor 104 may utilize machine-learning process and output manufacturing instruction based on inputted semantic datum and instruction training data. Machine-learning process may be implemented like any machine-learning process as described in more detail below in reference to FIG. 2. The machine-learning process using map training data may be distinct from the machine-learning process using extraction training data. Map training data may be used to train this particular machine-learning process. Processor 104 may be configured to transmit manufacturing instruction to a manufacturing device or user device 116. Manufacturing device may be a computing device configured to implement the manufacturing instruction to manufacture part for manufacture 112. Manufacturing device may be communicatively connected to one or more machines to manufacture part for manufacture 112 including, but not limited to, milling equipment and/or spark-erosive devices.

Continuing to refer to FIG. 1, system 100 may include an assignment module operating on GPU. Assignment module may include any hardware and/or software module. Assignment module may be configured to determine at least an orientation of two-dimensional print 108. Orientation, as described herein, is a plane parallel to the direction of machining the part, wherein the plane may be positioned on any direction. The direction, as described herein, may include any axis as described in the entirety of this disclosure. The axis may include, as a non-limiting example, a three-axis coordinate system, such as the x-axis, y-axis, and z-axis, or abscissa, ordinate, and applicate. As a further non-limiting example, the axis may include a five-axis system, such as two rotation axis, x-axis, y-axis, and z-axis. The axis may include, as a further non-limiting example, any rotational axis as a point and direction in the space, which may shift as a function of kinematic motion. In order to machine the entirety of the part, the at least an orientation needs to include planes to ensure all features of two-dimensional print 108 are machined wherein features include any feature as described in the entirety of this disclosure. For example and without limitation, a cylindrical part may be machined in its entirety from the at least an orientation consisting of planes perpendicular to the rotational axis of the cylinder. As a further non-limiting example, a cylindrical part with a hole in one side may be machined in its entirety from the at least an orientation consisting on planes on perpendicular to the rotational axis of the cylinder and the radial axis. Persons skilled in the art, upon reviewing the entirety of this disclosure, will be aware of various planes which may be suitable for use the at least an orientation consistently with this disclosure.

Continuing to refer to FIG. 1, determining each orientation of the plurality of orientations may further include generating a geodesic representative part model, wherein the geodesic representative part model includes the representative part model encased in a geodesic polygon. The "geodesic sphere", as described herein, is a computer model of a sphere, wherein the sphere is comprised of triangular elements. For example and without limitation, the triangular elements of the geodesic sphere may include any frequency of triangles. Further the triangular elements may be arranged in orientation, as a non-limiting example, the orientations may include a platonic solid, such as a tetrahedron, hexahedron, octahedron, dodecahedron, and an icosahedron. The representative part model may be encased in the geodesic sphere forming the geodesic representative part model. The representative part model may be oriented inside the geodesic sphere such that the entirety of the representative part model is within the geodesic sphere. As an example and without limitation, the representative part model may be oriented such that the origin of the representative part model is aligned with the origin of the geodesic sphere. Persons skilled in the art, upon reviewing the entirety of this disclosure, will be aware of various models which may be suitable for use the geodesic representative part model consistently with this disclosure.

With continued reference to FIG. 1, determining each orientation of the plurality of orientations may further include computing a thickness direction datum of the geodesic representative part model. The "thickness direction datum", as described herein, is the minimum distance between two parallel planes which enclose the representative part model within the geodesic representative part model in a given direction. Further, determining each orientation of the plurality of orientations may further include computing an accessibility cone represented by the geodesic sphere. The "accessibility cone", as described herein, is the tool reachable orientation from the location of the part. The geodesic sphere may include, for example and without limitation, any geodesic sphere as described in the entirety of this disclosure. For example and without limitation, the direction may include any axis as described in the entirety of this disclosure, such as an x-axis, y-axis, z-axis, and/or any rotational axis. As an example and without limitation, in 3-axis milling the z-axis may be assigned to compute the thickness direction datum. As a further example and without limitation, in 5-axis milling a rotational axis may be assigned to the direction in the accessibility cone. In an embodiment and without limitation, in 5-axis milling any axis may be assigned to the direction in the accessibility cone. In an embodiment, computing the accessibility cone includes performing ray tracing, such as reverse order ray tracing, wherein rays of light are traced from the surface of the part in the direction of the geodesic sphere. In the embodiment, ray tracing further includes determining visibility directions, wherein the visibility direction is a ray of light that does not contact the surface of the part. Ray tracing may include any methodology of ray tracing as described herein. Further, in the embodiment, ray tracing further includes conducting a tool reachability test on the GPU as a function of the visibility directions. For example and without limitation, the tool reachability test may include a collision test, gouge test, and the like. In an embodiment and without limitation, the visibility cone may be narrowed by considering the tool holder collision against the workpiece. In the embodiment, the milling orientation may be configured to be selected from the visibility cone. The visibility cone may include any visibility information as described in the entirety of this disclosure. In an embodiment and without limitation, any visibility information as described in the entirety of this disclosure, can be stored in the geodesic sphere and/or in the rasterized depth image of the representative part. In an embodiment, determining each orientation of the plurality of orientations may include computing a bitonic sorting algorithm. The bitonic sorting algorithm, as described herein, is a parallel sorting algorithm that performs $O(\log^2(n))$ comparisons. For example and without limitation, the bitonic sorting algorithm utilizes the thickness direction datum and a dominant surface normal. The dominant surface normal, as described herein, is the largest surface normal direction of each direction of the part. As an example and without limitation, the dominant surface normal is the z-axis when the z-height increase remains under 2× and the surface area is larger than the 20% of the XY plane projected area of the representative part model. Persons skilled in the art, upon reviewing the entirety of this disclosure, will be aware of various distances which may be suitable for use as the thickness direction datum consistently with this disclosure.

System 100 may include a simulation module operating on GPU. Simulation module may include any hardware and/or software module. Simulation module may be configured to generate a prospective part. A "prospective part", as used in this disclosure, is a computer model of two-dimensional print 108 that has been optimized for manufacturing. Optimization may be the design of two-dimensional print 108 that has the lowest manufacturing costs. In an embodiment, simulation module may utilize digital filters, as described herein, to perform the tool offset and the tool back offset operations, wherein the digital filter computes a new depth for each pixel as a function of the neighboring pixels. Tool offset is defined as the offset distance and tool back offset is defined as the material removal computation. Tool offset operates by exhausting all possible tool paths for the given tool, and tool back offset operates by simulating the machined surface for the tool offset and which gives the least amount of the left-over materials for the given tool. Digital filters may be applied to each side of the plurality of sides of two-dimensional print 108 wherein each filter is representative of a different milling tool. For example and without limitation, milling tools may include diameters of ¼", ⅛", 1/16", 1/32", and the like. As the diameter of the milling tool increases, the amount of tool offset distance increases.

Figure 2:
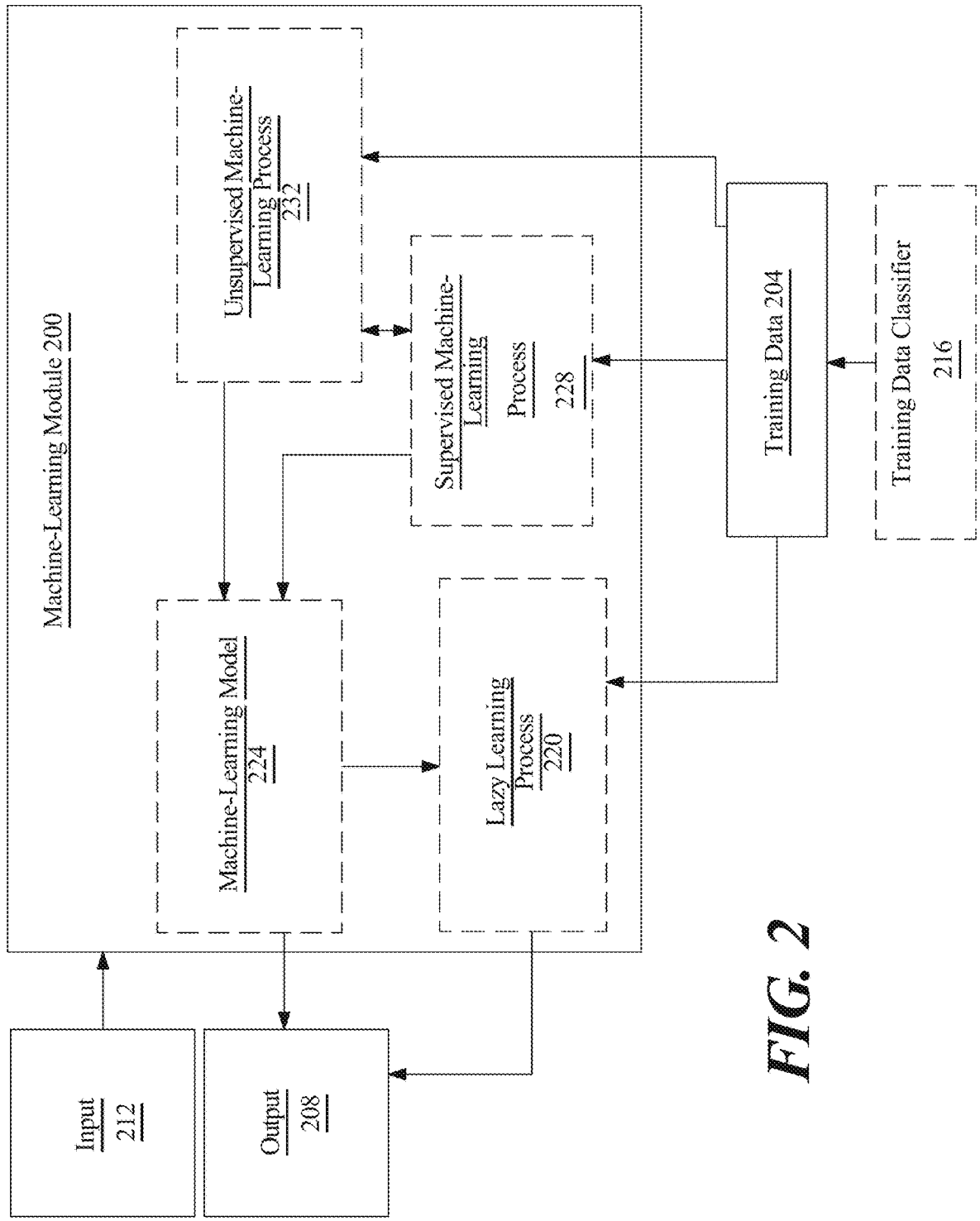
FIG. 2 illustrates a block diagram of an embodiment of a machine-learning module.

Referring now to FIG. 2, an exemplary embodiment of a machine-learning module 200 that may perform one or more machine-learning processes as described in this disclosure is illustrated. Machine-learning module may perform determinations, classification, and/or analysis steps, methods, processes, or the like as described in this disclosure using machine learning processes. A "machine learning process," as used in this disclosure, is a process that automatedly uses training data 204 to generate an algorithm that will be performed by a computing device/module to produce outputs 208 given data provided as inputs 212; this is in contrast to a non-machine learning software program where the commands to be executed are determined in advance by a user and written in a programming language.

Still referring to FIG. 2, "training data," as used herein, is data containing correlations that a machine-learning process may use to model relationships between two or more categories of data elements. For instance, and without limitation, training data 204 may include a plurality of data entries, each entry representing a set of data elements that were recorded, received, and/or generated together; data elements may be correlated by shared existence in a given data entry, by proximity in a given data entry, or the like. Multiple data entries in training data 204 may evince one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data 204 according to various correlations; correlations may indicate causative and/or predictive links between categories of data elements, which may be modeled as relationships such as mathematical relationships by machine-learning processes as described in further detail below. Training data 204 may be formatted and/or organized by categories of data elements, for instance by associating data elements with one or more descriptors corresponding to categories of data elements. As a non-limiting example, training data 204 may include data entered in standardized forms by persons or processes, such that entry of a given data element in a given field in a form may be mapped to one or more descriptors of categories. Elements in training data 204 may be linked to descriptors of categories by tags, tokens, or other data elements; for instance, and without limitation, training data 204 may be provided in fixed-length formats, formats linking positions of data to categories such as comma-separated value (CSV) formats and/or self-describing formats such as extensible markup language (XML), JavaScript Object Notation (JSON), or the like, enabling processes or devices to detect categories of data.

Alternatively or additionally, and continuing to refer to FIG. 2, training data 204 may include one or more elements that are not categorized; that is, training data 204 may not be formatted or contain descriptors for some elements of data. Machine-learning algorithms and/or other processes may sort training data 204 according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, a person's name may be identified by reference to a list, dictionary, or other compendium of terms, permitting ad-hoc categorization by machine-learning algorithms, and/or automated association of data in the data entry with descriptors or into a given format. The ability to categorize data entries automatedly may enable the same training data 204 to be made applicable for two or more distinct machine-learning algorithms as described in further detail below. Training data 204 used by machine-learning module 200 may correlate any input data as described in this disclosure to any output data as described in this disclosure.

Further referring to FIG. 2, training data may be filtered, sorted, and/or selected using one or more supervised and/or unsupervised machine-learning processes and/or models as described in further detail below; such models may include without limitation a training data classifier 216. Training data classifier 216 may include a "classifier," which as used in this disclosure is a machine-learning model as defined below, such as a mathematical model, neural net, or program generated by a machine learning algorithm known as a "classification algorithm," as described in further detail below, that sorts inputs into categories or bins of data, outputting the categories or bins of data and/or labels associated therewith. A classifier may be configured to output at least a datum that labels or otherwise identifies a set of data that are clustered together, found to be close under a distance metric as described below, or the like. Machine-learning module 200 may generate a classifier using a classification algorithm, defined as a process whereby a computing device and/or any module and/or component operating thereon derives a classifier from training data 204. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers.

Still referring to FIG. 2, machine-learning module 200 may be configured to perform a lazy-learning process 220 and/or protocol, which may alternatively be referred to as a "lazy loading" or "call-when-needed" process and/or protocol, may be a process whereby machine learning is conducted upon receipt of an input to be converted to an output, by combining the input and training set to derive the algorithm to be used to produce the output on demand. For instance, an initial set of simulations may be performed to cover an initial heuristic and/or "first guess" at an output and/or relationship. As a non-limiting example, an initial heuristic may include a ranking of associations between inputs and elements of training data 204. Heuristic may include selecting some number of highest-ranking associations and/or training data 204 elements. Lazy learning may implement any suitable lazy learning algorithm, including without limitation a K-nearest neighbors algorithm, a lazy naïve Bayes algorithm, or the like; persons skilled in the art, upon reviewing the entirety of this disclosure, will be aware of various lazy-learning algorithms that may be applied to generate outputs as described in this disclosure, including without limitation lazy learning applications of machine-learning algorithms as described in further detail below.

Alternatively or additionally, and with continued reference to FIG. 2, machine-learning processes as described in this disclosure may be used to generate machine-learning models 224. A "machine-learning model," as used in this disclosure, is a mathematical and/or algorithmic representation of a relationship between inputs and outputs, as generated using any machine-learning process including without limitation any process as described above, and stored in memory; an input is submitted to a machine-learning model 224 once created, which generates an output based on the relationship that was derived. For instance, and without limitation, a linear regression model, generated using a linear regression algorithm, may compute a linear combination of input data using coefficients derived during machine-learning processes to calculate an output datum. As a further non-limiting example, a machine-learning model 224 may be generated by creating an artificial neural network, such as a convolutional neural network comprising an input layer of nodes, one or more intermediate layers, and an output layer of nodes. Connections between nodes may be created via the process of "training" the network, in which elements from a training data 204 set are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 2, machine-learning algorithms may include at least a supervised machine-learning process 228. At least a supervised machine-learning process 228, as defined herein, include algorithms that receive a training set relating a number of inputs to a number of outputs, and seek to find one or more mathematical relations relating inputs to outputs, where each of the one or more mathematical relations is optimal according to some criterion specified to the algorithm using some scoring function. For instance, a supervised learning algorithm may include inputs described in this disclosure as inputs, outputs described in this disclosure as outputs, and a scoring function representing a desired form of relationship to be detected between inputs and outputs; scoring function may, for instance, seek to maximize the probability that a given input and/or combination of elements inputs is associated with a given output to minimize the probability that a given input is not associated with a given output. Scoring function may be expressed as a risk function representing an "expected loss" of an algorithm relating inputs to outputs, where loss is computed as an error function representing a degree to which a prediction generated by the relation is incorrect when compared to a given input-output pair provided in training data 204. Persons skilled in the art, upon reviewing the entirety of this disclosure, will be aware of various possible variations of at least a supervised machine-learning process 228 that may be used to determine relation between inputs and outputs. Supervised machine-learning processes may include classification algorithms as defined above.

Further referring to FIG. 2, machine learning processes may include at least an unsupervised machine-learning processes 232. An unsupervised machine-learning process, as used herein, is a process that derives inferences in datasets without regard to labels; as a result, an unsupervised machine-learning process may be free to discover any structure, relationship, and/or correlation provided in the data. Unsupervised processes may not require a response variable; unsupervised processes may be used to find interesting patterns and/or inferences between variables, to determine a degree of correlation between two or more variables, or the like.

Still referring to FIG. 2, machine-learning module 200 may be designed and configured to create a machine-learning model 224 using techniques for development of linear regression models. Linear regression models may include ordinary least squares regression, which aims to minimize the square of the difference between predicted outcomes and actual outcomes according to an appropriate norm for measuring such a difference (e.g. a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression is combined with multiplying the least-squares term by a factor of 1 divided by double the number of samples. Linear regression models may include a multi-task lasso model wherein the norm applied in the least-squares term of the lasso model is the Frobenius norm amounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g. a quadratic, cubic or higher-order equation) providing a best predicted output/actual output fit is sought; similar methods to those described above may be applied to minimize error functions, as will be apparent to persons skilled in the art upon reviewing the entirety of this disclosure.

Continuing to refer to FIG. 2, machine-learning algorithms may include, without limitation, linear discriminant analysis. Machine-learning algorithm may include quadratic discriminate analysis. Machine-learning algorithms may include kernel ridge regression. Machine-learning algorithms may include support vector machines, including without limitation support vector classification-based regression processes. Machine-learning algorithms may include stochastic gradient descent algorithms, including classification and regression algorithms based on stochastic gradient descent. Machine-learning algorithms may include nearest neighbors algorithms. Machine-learning algorithms may include various forms of latent space regularization such as variational regularization. Machine-learning algorithms may include Gaussian processes such as Gaussian Process Regression. Machine-learning algorithms may include cross-decomposition algorithms, including partial least squares and/or canonical correlation analysis. Machine-learning algorithms may include naïve Bayes methods. Machine-learning algorithms may include algorithms based on decision trees, such as decision tree classification or regression algorithms. Machine-learning algorithms may include ensemble methods such as bagging meta-estimator, forest of randomized tress, AdaBoost, gradient tree boosting, and/or voting classifier methods. Machine-learning algorithms may include neural net algorithms, including convolutional neural net processes.

Figure 3:
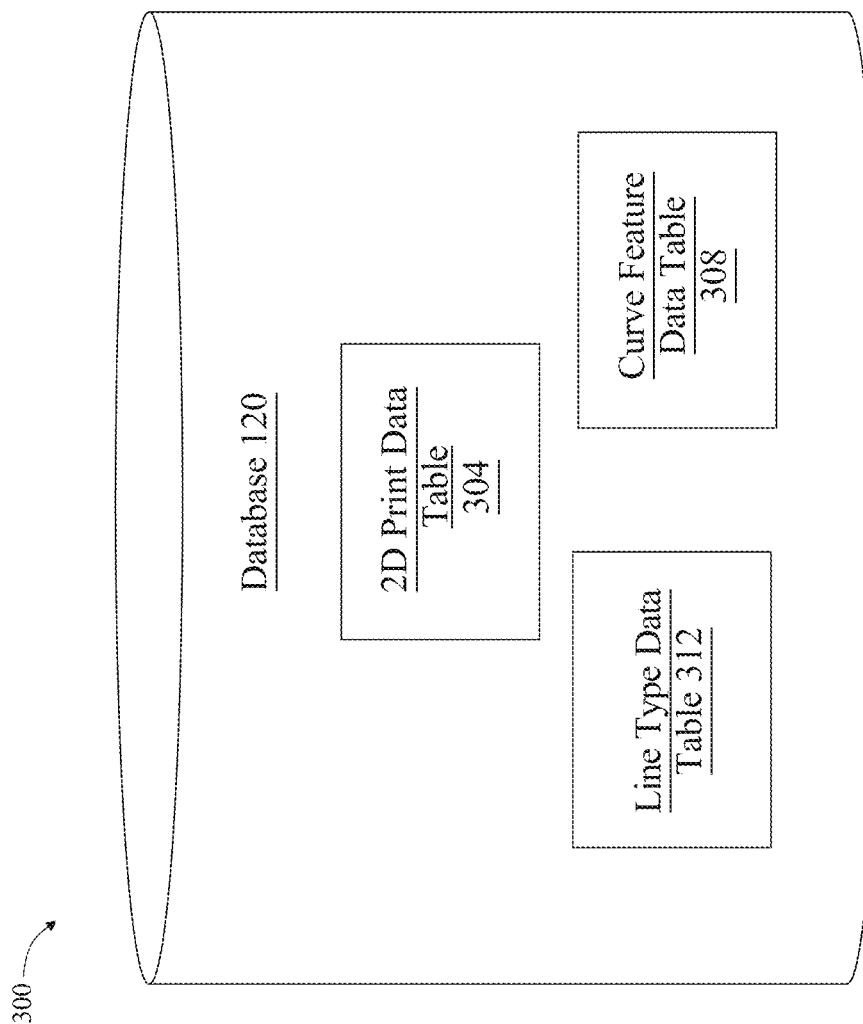
FIG. 3 is a block diagram illustrating an embodiment of an internal database.

Referring now to FIG. 3, an embodiment of database 120 is illustrated. Database 120 may be implemented as a hardware and/or software module. Database 120 may be implemented, without limitation, as a relational database, a key-value retrieval datastore such as a NOSQL database, or any other format or structure for use as a datastore that a person skilled in the art would recognize as suitable upon review of the entirety of this disclosure. Database 120 may contain datasets that may be utilized by unsupervised machine-learning model 200 to find trends, cohorts, and shared datasets between data contained within database 120 and two-dimensional print 108. In an embodiment, datasets contained within database 120 may be categorized and/or organized according to shared characteristics. For instance and without limitation, one or more tables contained within database 120 may include representative part model data table 300, wherein two-dimensional print data table 304 may include stored two-dimensional print 108. As a further example and without limitation, one or more tables contained within database 120 may include curve feature data table 308, wherein curve feature data table 308 may include stored curve feature 124. As a further example and without limitation, one or more tables contained within database 120 may include line type data table 312, wherein line type data table 312 may include stored line type 132.

With continued reference to FIG. 3, one or more tables contained within database 120 may include a semantic data table. Semantic data table may include extraction training data. As discussed above, extraction training data may include shapes, symbols, annotations, text, embedded information, and/or the like that contain semantic information as discussed above including the associated measurements and components of part for manufacture 112, and corresponding semantic datum.

Still referring to FIG. 3, one or more tables contained within database 120 may include manufacturing instruction data table. Manufacturing instruction data table may include datasets classified by the attributes of the part to be manufactured contained within two-dimensional print 108. The manufacturing instruction data table may contain datasets describing material information, for example and without limitation, datasets describing metals, ASTM material standards, thermoplastics, thermosets, ceramics, graphite, biodegradable materials, medical and biochemical materials, nylons, acetals, polycarbonates, and the like. The manufacturing instruction data table may further contain datasets describing part count data, such as datasets describing total amount of parts for manufacture, for example and without limitation, by directly matching the numbers of parts for manufacture in two-dimensional print 108, a range of numbers of parts for manufacture, a minimum and/or maximum threshold of numbers of parts for manufacture, and the like. The manufacturing instruction data table may further contain datasets describing face count data, such as describing the total amount of faces on part for manufacture 112, for example and without limitation, by directly matching the number of faces on part for manufacture 112 contained within two-dimensional print 108, a range of number of faces on the part for manufacture 112, a minimum and/or maximum threshold of faces on the part for manufacture 112, and the like. The manufacturing instruction data table may further contain datasets describing horizontal hole data, such as datasets describing the total number of horizontal holes contained in part for manufacture 112, for example and without limitation, by directly matching the number of horizontal holes on part for manufacture 112 contained in two-dimensional print 108, a range of numbers of horizontal holes in the part for manufacture 112, a minimum and/or maximum threshold of numbers of horizontal holes in the part for manufacture 112, and the like. The manufacturing instruction data table may further contain datasets describing vertical hole count data, such as datasets describing the total number of vertical holes contained in part for manufacture 112, for example and without limitation, by directly matching the number of vertical holes on the part for manufacture 112 contained in two-dimensional print 108, a range of numbers of vertical holes in the part for manufacture 112, a minimum and/or maximum threshold of numbers of vertical holes in the part for manufacture 112, and the like. Manufacturing instruction data table may include datasets classified by elements of the part of two-dimensional prints 108. Manufacturing instruction data table may include instruction training data.

Figure 4:
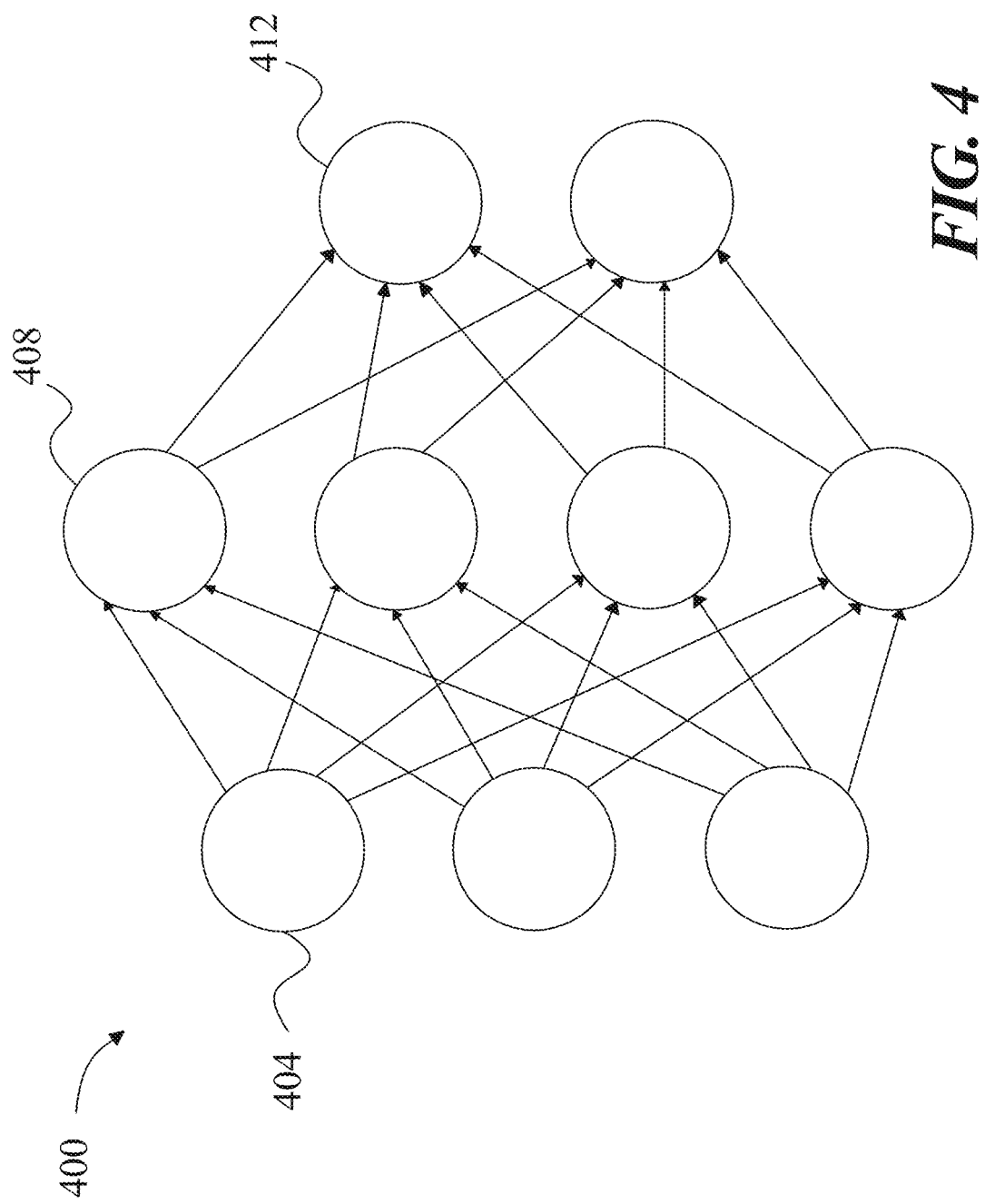
FIG. 4 illustrates an exemplary neural network.

Referring now to FIG. 4, an exemplary embodiment of neural network 400 is illustrated. A neural network 400 also known as an artificial neural network, is a network of "nodes," or data structures having one or more inputs, one or more outputs, and a function determining outputs based on inputs. Such nodes may be organized in a network, such as without limitation a convolutional neural network, including an input layer of nodes 404, one or more intermediate layers 408, and an output layer of nodes 412. Connections between nodes may be created via the process of "training" the network, in which elements from a training dataset are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning. Connections may run solely from input nodes toward output nodes in a "feed-forward" network or may feed outputs of one layer back to inputs of the same or a different layer in a "recurrent network." As a further non-limiting example, a neural network may include a convolutional neural network comprising an input layer of nodes, one or more intermediate layers, and an output layer of nodes. A "convolutional neural network," as used in this disclosure, is a neural network in which at least one hidden layer is a convolutional layer that convolves inputs to that layer with a subset of inputs known as a "kernel," along with one or more additional layers such as pooling layers, fully connected layers, and the like.

Figure 5:
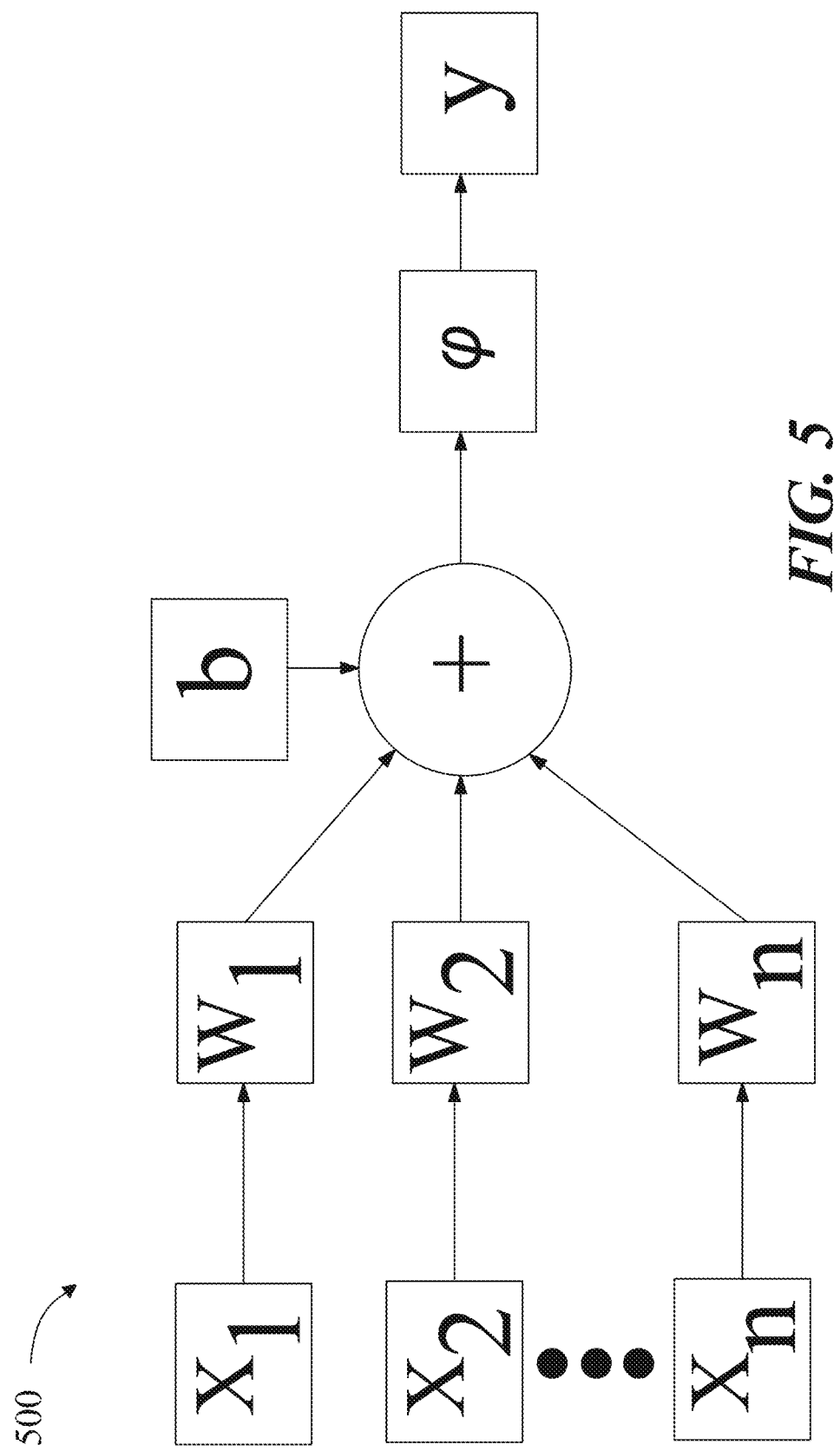
FIG. 5 is a block diagram of an exemplary node.

Referring now to FIG. 5, an exemplary embodiment of a node of a neural network is illustrated. A node may include, without limitation a plurality of inputs $x_i$ that may receive numerical values from inputs to a neural network containing the node and/or from other nodes. Node may perform a weighted sum of inputs using weights $w_i$ that are multiplied by respective inputs $x_i$. Additionally or alternatively, a bias b may be added to the weighted sum of the inputs such that an offset is added to each unit in the neural network layer that is independent of the input to the layer. The weighted sum may then be input into a function φ, which may generate one or more outputs y. Weight $w_i$ applied to an input $x_i$ may indicate whether the input is "excitatory," indicating that it has strong influence on the one or more outputs y, for instance by the corresponding weight having a large numerical value, and/or a "inhibitory," indicating it has a weak effect influence on the one more inputs y, for instance by the corresponding weight having a small numerical value. The values of weights $w_i$ may be determined by training a neural network using training data, which may be performed using any suitable process as described above.

Figure 6:
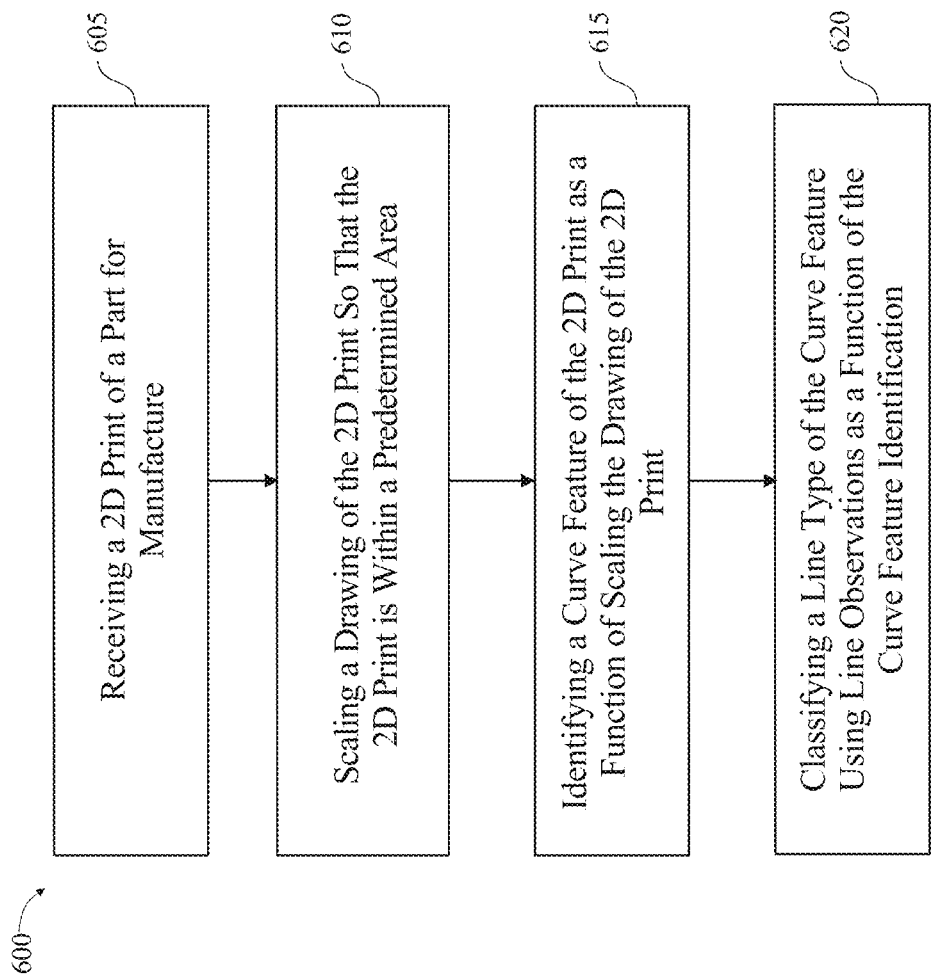
FIG. 6 is a process flow diagram illustrating an embodiment of a method for feature recognition of two-dimensional prints for manufacture.

Referring now to FIG. 6, an embodiment of method 600 for systems for feature recognition of two-dimensional prints for manufacture is illustrated. Method 600 is performed by a processor 104. Processor 104 may be any of the processors or computing device described herein with reference to FIGS. 1, 2, 3, and 8. two-dimensional print 108 may be any of the two-dimensional prints described herein with reference to FIGS. 1, 3, and 7.

Figure 7:
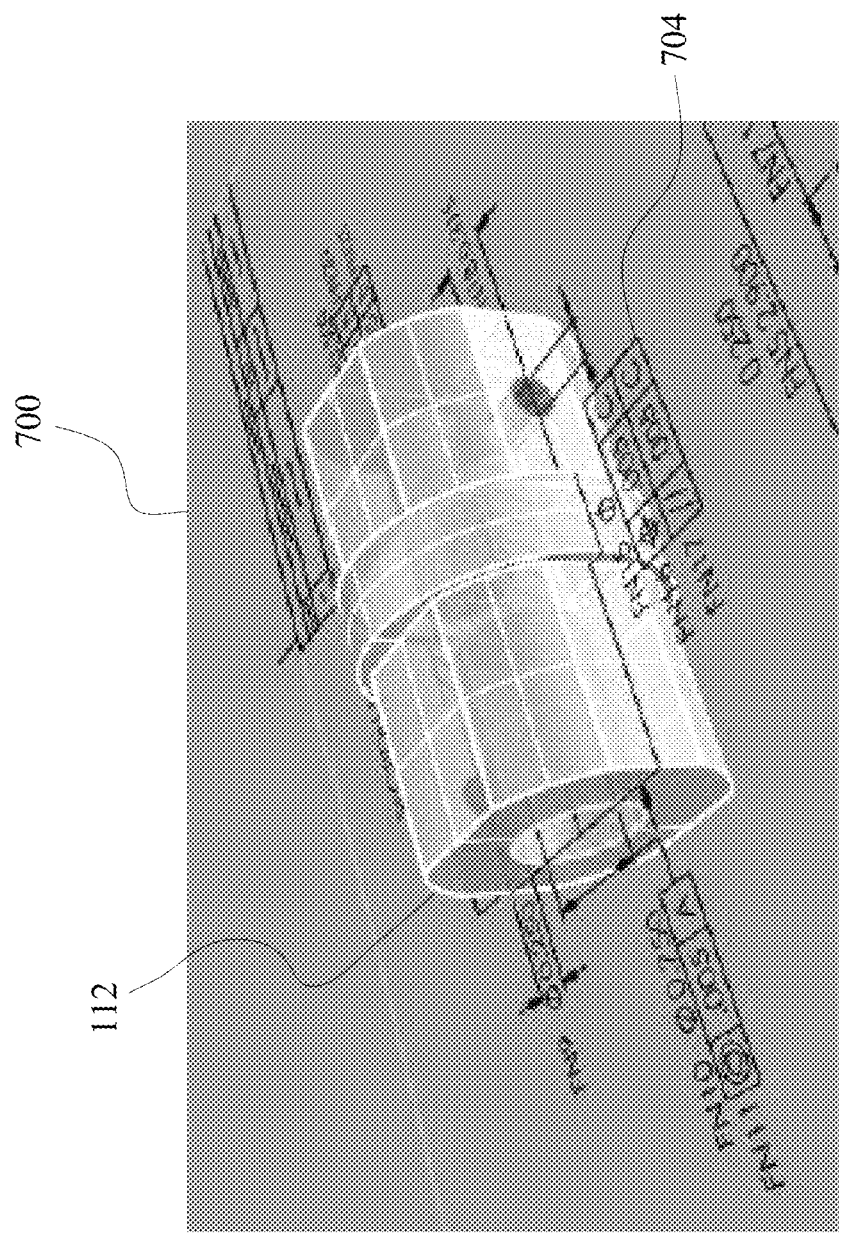
FIG. 7 is a screen shot of an exemplary embodiment of semantic datum mapped on a computer model.

Still referring to FIG. 6, at step 605, method 600 includes receiving a two-dimensional print 108 of a part for manufacture 112. two-dimensional print 108 is received by processor 104 through a web application. two-dimensional print 108 includes any information describing the part for manufacture. two-dimensional print 108 may be any of the two-dimensional prints described herein with reference to FIGS. 1, 3, and 7. Part of manufacture 112 may be any of the parts described herein with reference to FIGS. 1 and 7.

Still referring to FIG. 6, at step 610, method 600 includes scaling the two-dimensional print 108 to fit a predetermined area. Scaling a drawing of the two-dimensional print 108 includes resizing the drawing to an original size of the part of manufacture 112. Scaling a drawing of the two-dimensional print 108 includes verifying scale and dimensions of the drawing by comparing a length of an object line to a length stated in an annotation of the two-dimensional print 108. two-dimensional print 108 may be any of the two-dimensional prints described herein with reference to FIGS. 1, 3, and 7.

Still referring to FIG. 6, at step 615, method 600 includes identifying a curve feature 124 of the two-dimensional print 108 as a function of scaling the two-dimensional print 108, wherein the curve feature 124 comprises a plurality of line segments 128. Curve feature 124 is considered either a circle or an arc if a deviation from a fitted circle or arc is below a certain threshold. two-dimensional print 108 may be any of the two-dimensional prints described herein with reference to FIGS. 1, 3, and 7. Curve feature 124 may be any of the curve features described herein with reference to FIGS. 1 and 3. Plurality of line segments 128 may be any of the lines described herein with reference to FIG. 1.

Still referring to FIG. 6, at step 620, method 600 includes classifying curve feature 124 to a line type 132 as a function of the curve feature 124 identification and at least a line observation. Classifying a line type 132 of the curve feature includes the use of a probabilistic machine learning model. Line observations include superimposition of object lines on hidden lines. Line observations include positioning of center lines. Line observations include diameter annotations. Line type 132 may be any of the line types described herein with reference to FIGS. 1 and 3. Curve feature 124 may be any of the curve features described herein with reference to FIGS. 1 and 3.

Referring now to FIG. 7, an embodiment of semantic datum 704 mapped on a two-dimensional print 108 is illustrated. Computer model 700 includes a two-dimensional and three-dimensional image of part for manufacture 112. Semantic datum 704 may be mapped on computer model 700. Mapping may include inserting in computer model 700 semantic datum 704 from two-dimensional print 108. Mapping may include positioning semantic datum 704 in computer model 700 such that the semantic datum 704 aligns with the component of part for manufacture 112 in the two-dimensional print 108 with which the semantic datum 704 concerns. As used in this disclosure, a "component" of a part for manufacture is a feature, part, and/or piece of the part for manufacture. For example, mapping may include inserting a semantic datum 704 of a hole radius with an arrow that was pointing to the hole in the image of the part for manufacture 112 in two-dimensional print 108 into computer model 700 such that the arrow points to the corresponding hole in the image of the part for manufacture 112 in the computer model. Processor 104 may be configured to compare dimensions and/or coordinates of components of part for manufacture 112 in two-dimensional print 108 and computer model 700 and associate the same components to transfer semantic datum 704 extracted from the two-dimensional print 108 onto the computer model 700. Association may include matching one or more measurements and/or descriptions of a component in two-dimensional print 108 with a component in computer model 700 including, without limitation, coordinates, height, length, width, radius, position on part for manufacture 112, and/or the like. For example, processor 104 may associate a circle in two-dimensional print 108 to a cylinder in computer model 700 by comparing their corresponding radii, coordinates, and/or other measurements. As another example, processor 104 may associate a circle designated by a position GD&T symbol assigned to a 0.5 diameter in two-dimensional print 108 to the only cylinder with a 0.25 radius in computer model 700. two-dimensional print 108 may include a concentricity GD&T symbol assigned to a 0.75 inch hole in two-dimensional print 108, which processor 104 may associate with the only 0.375 inch radius hole in computer model 700. Once components of part for manufacture 112 in two-dimensional print 108 are associated with their corresponding components of the part for manufacture 112 in computer model 700, then processor 104 may map semantic datum 704 on the computer model 700 while maintaining their relation to the corresponding measurements of the components. Similarly, processor 104 may associate a line in two-dimensional print 108 with a surface of part for manufacture 112 in computer model 700 by, for example, comparing the length of the line with the length of the surface and/or comparing the positions of the line and surface on the corresponding images of part for manufacture 112 and/or in relational position to other components of the part for manufacture 112. As an additional example, mapping semantic datum 704 on computer model 700 of the part for manufacture may further comprise associating a line of two-dimensional print 108 of the part for manufacture to a plane of the computer model 700 of the part for manufacture. In some embodiments, processor 104 mapping semantic datum 704 on computer model 700 may include superimposing computer model 700, which may be a three-dimensional image of part for manufacture 112, onto two-dimensional print 108, which may include a two-dimensional image of the part for manufacture 112 and the original semantic datum 704, such that the three-dimensional image is positioned on the two-dimensional image. As used in this disclosure, "superimposing" is placing or laying an image or information over another image or information. For example, superimposing a three-dimensional image of part for manufacture 112 onto two-dimensional print 108 may include placing or laying the three-dimensional image of the part for manufacture 112 onto the image of the part for manufacture 112 in the two-dimensional print 108. Thus, the semantic datum 704 on two-dimensional print 108 may align with the corresponding components of computer model 700 of part for manufacture 112. In some embodiments, processor 104 may align an outer profile of a three-dimensional image of part for manufacture 112 in computer model 700 with an outer profile of a two-dimensional image of part for manufacture 112 in two-dimensional print 108.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 8:
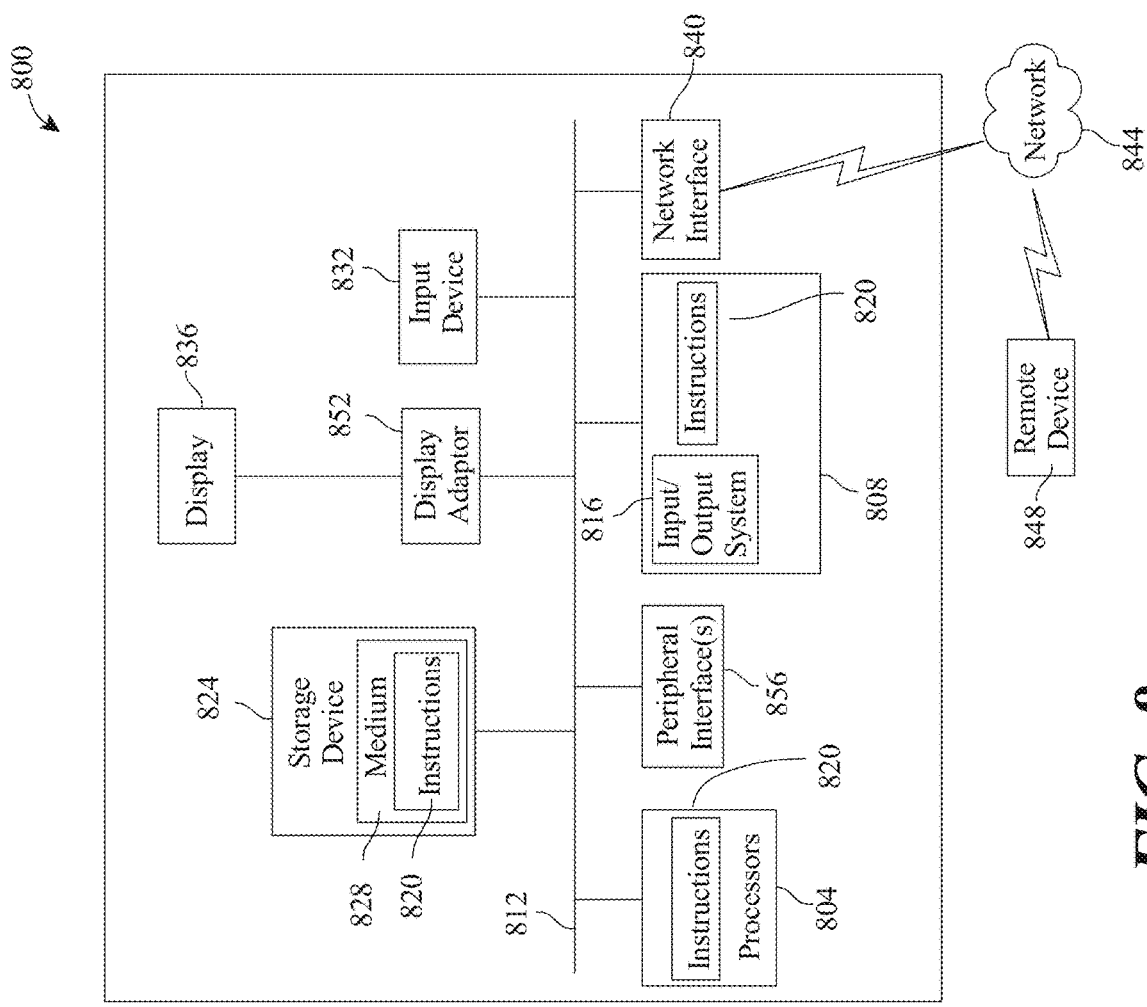
FIG. 8 is a block diagram of a computing system that can be used to implement any one or more of the methodologies disclosed herein and any one or more portions thereof.

FIG. 8 shows a diagrammatic representation of one embodiment of a computing device in the exemplary form of a computer system 800 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 800 includes a processor 804 and a memory 808 that communicate with each other, and with other components, via a bus 812. Bus 812 may include any of several types of bus structures including, but not limited to, a memory bus, a memory controller, a peripheral bus, a local bus, and any combinations thereof, using any of a variety of bus architectures.

Processor 804 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 804 may be organized according to Von Neumann and/or Harvard architecture as a non-limiting example. Processor 804 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), and/or system on a chip (SoC).

Memory 808 may include various components (e.g., machine-readable media) including, but not limited to, a random-access memory component, a read only component, and any combinations thereof. In one example, a basic input/output system 816 (BIOS), including basic routines that help to transfer information between elements within computer system 800, such as during start-up, may be stored in memory 808. Memory 808 may also include (e.g., stored on one or more machine-readable media) instructions (e.g., software) 820 embodying any one or more of the aspects and/or methodologies of the present disclosure. In another example, memory 808 may further include any number of program modules including, but not limited to, an operating system, one or more application programs, other program modules, program data, and any combinations thereof.

Computer system 800 may also include a storage device 824. Examples of a storage device (e.g., storage device 824) include, but are not limited to, a hard disk drive, a magnetic disk drive, an optical disc drive in combination with an optical medium, a solid-state memory device, and any combinations thereof. Storage device 824 may be connected to bus 812 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 824 (or one or more components thereof) may be removably interfaced with computer system 800 (e.g., via an external port connector (not shown)). Particularly, storage device 824 and an associated machine-readable medium 828 may provide nonvolatile and/or volatile storage of machine-readable instructions, data structures, program modules, and/or other data for computer system 800. In one example, software 820 may reside, completely or partially, within machine-readable medium 828. In another example, software 820 may reside, completely or partially, within processor 804.

Computer system 800 may also include an input device 832. In one example, a user of computer system 800 may enter commands and/or other information into computer system 800 via input device 832. Examples of an input device 832 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 832 may be interfaced to bus 812 via any of a variety of interfaces (not shown) including, but not limited to, a serial interface, a parallel interface, a game port, a USB interface, a FIREWIRE interface, a direct interface to bus 812, and any combinations thereof. Input device 832 may include a touch screen interface that may be a part of or separate from display 836, discussed further below. Input device 832 may be utilized as a user selection device for selecting one or more graphical representations in a graphical interface as described above.

A user may also input commands and/or other information to computer system 800 via storage device 824 (e.g., a removable disk drive, a flash drive, etc.) and/or network interface device 840. A network interface device, such as network interface device 840, may be utilized for connecting computer system 800 to one or more of a variety of networks, such as network 844, and one or more remote devices 848 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 844, may employ a wired and/or a wireless mode of communication. In general, any network topology may be used. Information (e.g., data, software 820, etc.) may be communicated to and/or from computer system 800 via network interface device 840.

Computer system 800 may further include a video display adapter 852 for communicating a displayable image to a display device, such as display device 836. Examples of a display device include, but are not limited to, a liquid crystal display (LCD), a cathode ray tube (CRT), a plasma display, a light emitting diode (LED) display, and any combinations thereof. Display adapter 852 and display device 836 may be utilized in combination with processor 804 to provide graphical representations of aspects of the present disclosure. In addition to a display device, computer system 800 may include one or more other peripheral output devices including, but not limited to, an audio speaker, a printer, and any combinations thereof. Such peripheral output devices may be connected to bus 812 via a peripheral interface 856. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods and systems according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. An apparatus for feature recognition of two-dimensional prints, wherein the apparatus comprises:
   a processor; and
   a memory communicatively connected to the processor, the memory containing instructions configuring the processor to:
      receive a two-dimensional print of a part for manufacture;
      scale the two-dimensional print to fit a predetermined area, wherein scaling the two-dimensional print includes:
         determining an original size of the part; and
         resizing the two-dimensional print to the original size of the part;
      identify a curve feature of the two-dimensional print as a function of scaling the two-dimensional print, wherein the curve feature comprises a plurality of line segments; and
      classify the curve feature to a line type of as a function of the curve feature identification and at least a line observation.

2. The apparatus of claim 1, wherein receiving the two-dimensional print further comprises receiving the two-dimensional print through a web application.

3. The apparatus of claim 1, wherein the two-dimensional print includes an object line and scaling the two-dimensional print includes:
   comparing a length of the object line to a length stated in an annotation of the two-dimensional print; and
   validating scale and dimensions of the two-dimensional print as a function of the comparison.

4. The apparatus of claim 1, wherein identifying the curve feature further comprises:
   determining that the curve feature strays from a perfectly circular circle by less than a preconfigured threshold; and
   identifying the curve as a circle as a function of the determination.

5. The apparatus of claim 1, wherein identifying the curve feature further comprises:
   determining that the curve feature strays from a perfectly circular arc by less than a preconfigured threshold; and
   identifying the curve as an arc as a function of the determination.

6. The apparatus of claim 1, wherein classifying includes classifying the line type as a function of a probabilistic machine learning model.

7. The apparatus of claim 1, wherein the at least a line observation includes a superimposition of object lines on hidden lines.

8. The apparatus of claim 1, wherein the at least a line observation includes a positioning of center lines.

9. The apparatus of claim 1, wherein the at least a line observation includes at least a diameter annotation.

10. A method for feature recognition of two-dimensional prints, wherein the method is performed by a processor and comprises:
   receiving a two-dimensional print of a part for manufacture;
   scaling the two-dimensional print to fit a predetermined area, wherein scaling the two-dimensional print includes:
      determining an original size of the part; and
      resizing the two-dimensional print to the original size of the part;
   identifying a curve feature of the two-dimensional print as a function of scaling the two-dimensional print, wherein the curve feature comprises a plurality of line segments; and
   classifying curve feature to a line type as a function of the curve feature identification and at least a line observation.

11. The method of claim 10, wherein receiving the two-dimensional print further comprises receiving the two-dimensional print through a web application.

12. The method of claim 10, wherein the two-dimensional print includes an object line and scaling the two-dimensional print includes:
   comparing a length of the object line to a length stated in an annotation of the two-dimensional print; and
   validating scale and dimensions of the two-dimensional print as a function of the comparison.

13. The method of claim 10, wherein identifying the curve feature further comprises:
   determining that the curve feature deviates from a perfectly circular circle by less than a preconfigured threshold; and identifying the curve as a circle as a function of the determination.

14. The method of claim 10, wherein identifying the curve feature further comprises:
   determining that the curve feature deviates from a perfectly circular arc by less than a preconfigured threshold; and
   identifying the curve as an arc as a function of the determination.

15. The method of claim 10, wherein classifying includes classifying the line type as a function of a probabilistic machine learning model.

16. The method of claim 10, wherein the at least a line observation includes a superimposition of object lines on hidden lines.

17. The method of claim 10, wherein the at least a line observation includes a positioning of center lines.

18. The method of claim 10, wherein the at least a line observation includes at least a diameter annotation.

\* \* \* \* \*